(12) United States Patent
Stasiak

(10) Patent No.: US 6,962,844 B2
(45) Date of Patent: Nov. 8, 2005

(54) MEMORY DEVICE HAVING A SEMICONDUCTING POLYMER FILM

(75) Inventor: James Stasiak, Lebanon, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/923,482

(22) Filed: Aug. 20, 2004

(65) Prior Publication Data

US 2005/0017370 A1 Jan. 27, 2005

Related U.S. Application Data

(62) Division of application No. 10/171,738, filed on Jun. 14, 2002, now Pat. No. 6,828,685.

(51) Int. Cl.[7] .......................................... H01L 21/8234
(52) U.S. Cl. ...................... 438/237; 257/295; 257/529; 257/776; 257/777; 438/99; 438/710
(58) Field of Search ................ 257/295, 529, 257/776, 777; 438/237, 710, 99

(56) References Cited

U.S. PATENT DOCUMENTS

| | | | |
|---|---|---|---|
| 4,803,402 A | | 2/1989 | Raber |
| 5,060,191 A | | 10/1991 | Nagasaki |
| 6,212,093 B1 | | 4/2001 | Lindsey |
| 6,272,038 B1 | | 8/2001 | Clausen |
| 6,344,662 B1 | | 2/2002 | Dimitrakopoulos et al. |
| 6,352,854 B1 | | 3/2002 | Nova |
| 6,498,744 B2 | | 12/2002 | Gudesen et al. |
| 6,541,869 B1 | * | 4/2003 | Gudesen et al. ............ 257/777 |
| 6,552,409 B2 | * | 4/2003 | Taussig et al. .............. 257/529 |
| 6,670,659 B1 | * | 12/2003 | Gudesen et al. ............ 257/295 |
| 2001/0054709 A1 | | 12/2001 | Heath |

FOREIGN PATENT DOCUMENTS

| | | |
|---|---|---|
| EP | 1179863 | 2/2002 |
| EP | 1265287 | 12/2002 |
| WO | WO9730445 | 8/1997 |
| WO | WO0127972 | 4/2001 |

OTHER PUBLICATIONS

"Transient space charge limited current pulse shapes in molecularly doped polymers" by DM Goldie in "J. Phys.D.: Appl. Phys.32 (1999) 3058–3067" Printed in the UK PH:S0022–3727 (99)03831–0 pp. 3058–3067.

"The estimation of trap–free space charge limited current magnitudes in molecularly doped polymers" by D.M. Goldie, A.A.W. Macartney, R.A.G. Gibson & R.S. Gairns from "Philosophical Magazine B", 1997, vol. 75.No. 4. pp. 553–565.

(Continued)

Primary Examiner—David Nelms
Assistant Examiner—Dao H. Nguyen
(74) Attorney, Agent, or Firm—Donald J. Coulman

(57) ABSTRACT

A memory device includes a semiconducting polymer film, which includes an organic dopant. The semiconducting polymer film has a first side and a second side. The memory device also includes a first plurality of electrical conductors substantially parallel to each other coupled to the first side of the semiconducting polymer layer, and a second plurality of electrical conductors substantially parallel to each other, coupled to the second side of the semiconducting polymer layer. The first and second pluralities of electrical conductors are substantially mutually orthogonal to each other. Further, an electrical charge is localized on the organic dopant.

24 Claims, 11 Drawing Sheets

OTHER PUBLICATIONS

"Inter–layer mixing effect on the transport properties of a dual layer organic photoreceptor interface" by A.A.W.Macartney,D.M. Goldie, R.A.G. Gibson & R.S. Gairns from "Synthetic Metals" 67 (1994) pp. 201–205.

"Nanoimprint lithography:challenges and prospects" by S. Zankovych, T Hoffman, J Seekamp, J–U Bruch and CM Sotomayor Torres from Institute of Physics Publishing Nanotechnology 12 (2001) pp. 91–95.

"Multilevel nanoimprint lithography with submicron alignment over 4 in. Si Wafers" by Wei Zhang and Stephen Y. Chou from "Applied Physics Letters" vol. 79, No. 6, Aug. 6, 2001; pp. 845–847.

"Direct three–dimensional patterning using nanoimprint lithography" by Mingtao Li, Lei Chen and Stephen Y. Chou from "2001 American Institute of Physics" downloaded Apr. 29, 2002; pp. 3322–3324.

"Product information Resist mr–I 9000 series" from "Nanoimprint lithography" printed from the web url http://www.microresist.de/prod_info_mri9000.htm on Apr. 29, 2002; 5 pages.

"Directed Assembly of One Dimensional Nanostructures into Functional Networks" by Yu Huang, Xiangfeng Duan, Qingqiao Wei and Charles M. Lieber from "Science" vol. 291, Jan. 26, 2001 pp. 630–533.

* cited by examiner

MEMORY DEVICE HAVING A SEMICONDUCTING POLYMER FILM

This application is a divisional of U.S. application Ser. No. 10/171,738 filed Jun. 14,2002 now U.S. Pat. No. 6,828,685.

BACKGROUND

Description of the Art

Over the past few years, the demand for ever cheaper and lighter weight portable electronic devices has led to a growing need to manufacture durable, lightweight, and low cost electronic circuits including high density memory chips. Solid state memory devices, typically, have read write speeds on the order of nanoseconds, however, storage capacities of only a few Megabyte are typically achieved. On the other hand, mass storage devices, which usually have a rotating medium, have the capability of storing a few Gigabytes of data; however, they have read write speeds of the order of only milliseconds.

The ability to manufacture high capacity storage systems is typically constrained by the need to utilize movable or rotating parts, which is a relatively slow process compared to electronic circuit technology. In addition, reliability is an additional problem, in order to decrease the read write times the movable or rotating parts tend to be utilized at as highest speed as possible. Further, if the electronic device is used in a portable application the shock resistance of the system is typically a limitation. Power consumption, overall weight and size, and cost are also factors that limit storage systems.

The ability to fabricate solid-state memory circuits is typically constrained by the need to utilize silicon-based semiconductors and processing. Typically, silicon based memory devices involve complex architectures on single crystal semiconductor substrates, which results in higher cost. In addition, such complex architecture, typically, result in a reduction in the number of logic cells per unit area of the semiconductor substrate, leading to a reduction in the data storage density for a given chip size. Further, currently the fabrication of semiconducting circuits on polymer substrates, especially on flexible polymer substrates, is hindered by the typical harsh processing conditions for silicon-based devices such as high temperatures. Most polymer substrates have a relatively low melting or degradation temperature when compared to the deposition or annealing temperatures utilized in semiconductor processing. Thus, the semiconductor circuit elements are typically fabricated on semiconductor substrates such as single crystal silicon, and then separately mounted on the polymer substrate, requiring further interconnections, processing and cost.

One methodology utilized to get around the need for wafer level processing is the use of amorphous silicon-based thin film transistors (TFTs). However, this technology generally requires processing temperatures in the range of 300° C. to 400° C. that typically results in the melting or severe degradation of most polymer substrates.

There are a number of other problems in fabricating semiconducting circuits on polymer substrates. In general, only a limited number of polymers, such as polyimides, are available that can withstand the temperatures utilized in fabricating silicon semiconducting circuits. In addition, compatibility can be an issue; for example the difference in thermal expansion between silicon and polymers is large, typically resulting in thermal stress that can affect device performance. Under some conditions it can lead to delamination of the silicon from the polymer substrate. Further, the deposition of silicon typically requires sophisticated and expensive equipment that requires a vacuum and is optimized for deposition on wafers. These problems render impractical the manufacture of durable, lightweight, and low cost electronic memory devices.

DESCRIPTION OF THE PREFERRED EMBODIMENTS

Figure 1A:
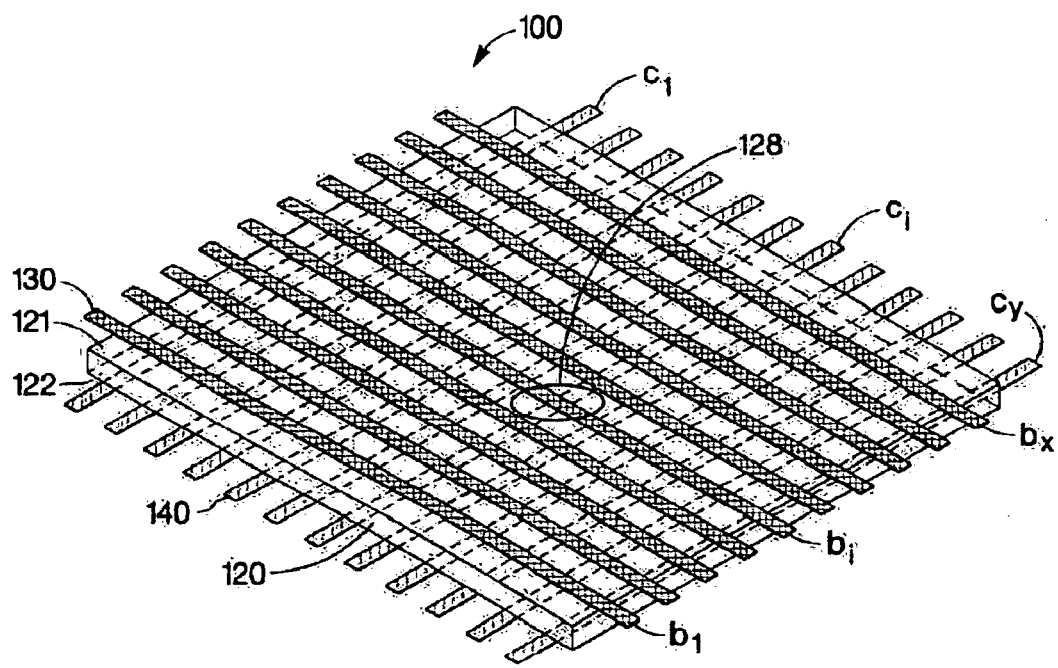
FIG. 1 is a perspective view of a memory device according to an embodiment of this invention.
FIG. 1b is a cross-sectional view of a memory device according to an embodiment of this invention.

Referring to FIG. 1a, an exemplary embodiment of memory device 100 of the present invention is shown in a perspective view. In this embodiment, semiconducting polymer film 120 forms a layer that includes an organic dopant (see FIG. 1b). On the top surface, also referred to as first side 121, of semiconducting polymer film 120, a plurality of electrical conductors 130 are formed and are denoted as $b_j$. Electrical conductors 130 are substantially parallel to each other. On the bottom surface, also referred to as second side 122, of semiconducting polymer film 120 are formed a corresponding plurality of electrical conductors 140 that are substantially parallel to each other and are substantially mutually orthogonal to electrical conductors 130. The electrical conductors 140 are denoted as $c_i$. The combination of electrical conductors 130 and 140 form a planar orthogonal x, y matrix. Logic cell 128 includes the volume of semiconducting polymer film 120 between any two intersecting electrical conductors. An array of dynamic memory logic cells can thus be formed whose electrical properties can represent a 0 or 1.

It should be noted that the drawings are not true to scale. Certain dimensions have been exaggerated, in relation to other dimensions, in order to provide a clearer illustration and understanding of the present invention. In addition, for clarity not all cross-hatching or lines are shown in each cross-sectional view. Further, although the embodiments illustrated herein are shown in two-dimensional views with various regions having depth and width, it should be understood that these regions are illustrations of only a portion of a device that is actually a three-dimensional structure. Accordingly, these regions will have three dimensions, including, length, width and depth, when fabricated on an actual device.

Figure 1B:
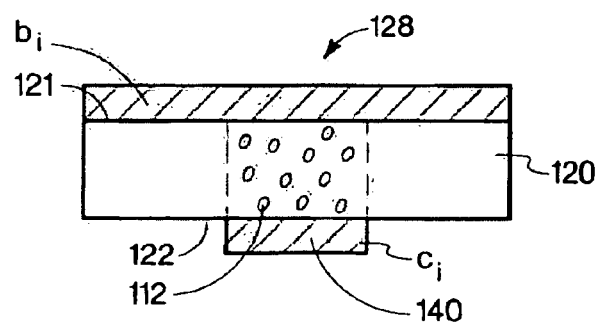

A more detailed cross-sectional view of logic cell 128 is shown in FIG. 1b. In this embodiment, organic dopant material 112 is added to a binder material in the range from about 0.01 weight percent to about 50 weight percent, particularly from about 0.1 weight percent to about 25 weight percent, and more particularly from about 5 weight percent to about 15 weight percent. The thickness of semiconducting polymer film 120 is in the range from about 0.01 micrometers to about 25 micrometers and more particularly in the range from about 0.01 micrometers to about 12 micrometers. The particular thickness will depend upon the electrical characteristics desired and the particular application of memory device 100.

The binder or matrix polymer for semiconducting polymer film 120 may be selected from a wide range of polymers such as polycarbonate, polyester, polyimide, polystyrene, polyvinylchloride, polymethylmethacrylate, polyvinyl acetate, vinylchloride/vinylacetate copolymers, acrylic resin, polyacrylonitrile, polyamide, polyketones, polyacrylamide, and other similar materials. The material chosen for the binder will depend on the particular electrical characteristics desired, processing conditions, as well as the environmental conditions in which the device will be utilized. However, for many applications the binder is a polycarbonate, polystyrene, or polyester. In this embodiment, the binder material is a bisphenol-A-polycarbonate with a number average molecular weight (Mn) in the range from about 5,000 to about 50,000, and more particularly from about 30,000 to about 35,000 and a polydispersity index of below about 2.5. An example of a commercially available polycarbonate that can be used as a binder or matrix polymer is a bisphenol-A-polycarbonate available from The Bayer Group under the trademark "MAKROLON-5208" that has an Mn of about 34,500 and a polydispersity index of about 2.

Organic dopant material 112 may contain either electron donor or electron acceptor molecules, or functional groups, or a mixture of both in a polymer host or binder. In an alternate embodiment, semiconducting polymer film 120 may include separate electron donor and electron acceptor layers. Organic dopant material 112 may provide a trapping site for injected charge. Charge transport, in the form of hole or electron transport, may thus occur between adjacent donor or acceptor molecules, respectively. Such a process can be described as a one-electron oxidation or reduction process between neutral functional groups and their charged derivatives. The transport processes, in semiconducting polymer film 120, will depend on the dopant molecule or functional group, the dopant cocentration, and the polymer host or binder material. The particular molecule or functional group utilized will depend on the particular electrical characteristics desired for memory device 100, as well as the particular application memory device will be utilized in. The electron donor or acceptor functional groups, of the present invention, can be associated with a dopant molecule, pendant groups of a polymer, or the polymer main chain itself.

Examples of dopant molecules or functional groups that may be utilized in this embodiment include various arylalkanes, arylamines including diarylamines and triarylamines, benzidine derivatives such as N,N,N',N',-Tetrakis(4-methylphenyl)-benzidine or N,N'-Di (naphthalene-1-yl)-N,N'-diphenyl-benzidine, enamines, pyrzoline derivatives such as 1-phenyl-3-(p-diethylamino-styryl)-5-(p-diethylamino-phyenyl)-pyrazolin or 1-phyenyl-3-(2-chloro-styryl)-5-(2-chloro-phyenyl)-pyrazolin, hyrdazones, oxidiazoles, triazoles, and oxazoles. In addition, compounds such as 1,1-Bis(4-bis(4-methylphenyl) aminophenyl)cyclohexane, Titanium (IV) oxide phthalocyanine, and other metal or metal oxide complexed phthalocyanines such as copper or Vandium (IV) oxide may also be utilized. Further, polymers such as poly(N-vinylcarbazole), poly4-[diphenylaminophenyl) methylmethacrylate], poly[(N-ethylcarbazolyl-3-yl)methyl acrylate], poly (N-epoxypropylcarbazole), poly[3-carbazolyl-9-yl)propyl]methylsiloxane, polysilylenes, and polygermylenes can also be utilized as dopants. Other molecules or functional groups that may be utilized as dopants in this embodiment, include various fluorenone derivatives such as 2,4,7 trinitro-9-fluorenone or n-butyl 9-dicayanomethylenefluorenone-4-carboxylate, diphenoquinones, sulfones, anthraquinones, and oxadiazoles. The particular molecule chosen will depend, for example, on the particular electronic properties desired such as whether an electron donor or electron acceptor dopand is desired. For Example, various arylalkanes, arylamines, or hydrazones can be utilized as donor dopants, whereas various fluorenone derivatives can be utilized as acceptor dopants.

In one embodiment organic dopant 112 utilized in semiconducting polymer film 120 is a mono-substituted diphenylhydrazone compound (DPH) having the structure R1-CH=N—N(C6H6)2. R1 may be saturated carbon chains of from C1 to C6, unsaturated carbon chains of from C1 to C6, a cyclohexyl group, a cyclopentyl group, unsubstituted phenyl groups, substituted phenyl groups, unsubstituted benzyl groups, substituted benzyl groups, and mixtures thereof. In another embodiment, organic dopant 112 is a di-substituted amino benzaldehyde diphenylhydrazone having the structure R2R3-N—C6H6—CH=N—N(C6H6)2 where R2 and R3 may independently be saturated carbon chains of from C1 to C6, unsaturated carbon chains of from C1 to C6, a cyclohexyl group, a cyclopentyl group, unsubstituted phenyl groups, substituted phenyl groups, unsubstituted benzyl groups, substituted benzyl groups, and mixtures thereof. More particularly, the compound p-(diethylamino) benzaldehyde diphenylhydrazone may be utilized for organic dopand 112.

Electrical conductors 130 and 140 may be formed from a metal. Examples of metals that can be utilized are gold, chromium, aluminum, indium, tin, lead, antimony, platinum, titanium, tungsten, tantalum, silver, copper, molybdenum, and similar metals as well as combinations thereof. In this embodiment, electrical conductors 130 and 140 may also be formed from conductive materials such as polyaniline, polypyrrole, pentacene, anthracene, napthacene, phenanthrene, pyrene, thiophene compounds, tetrathiafulvalene derivatives such as Bis-cyclohexyl-tetrathiafulvalene, or 4,4'-Diphenyl-tetrathiafulvalene, conductive ink, and similar materials. The material chosen for the electrical conductors will depend on the particular electrical characteristics desired, processing conditions, as well as the environmental conditions in which the device will be utilized. For some applications, the electrical conductors are formed from polyaniline or thiophene compounds such as poly (3,4-ethylene dioxythiophene) (PEDOT) or camphorsulfonic acid doped polyaniline. The thickness of the electrical conductors is in the range from about 0.01 micrometers to about 1.0 micrometer, however, depending upon characteristics desired both thicker and thinner contacts may be utilized. In an alternate embodiment, electrical conductors 130 may be formed from a substantially optically transparent electrically conductive material such as indium tin oxide. Such conductors provide for erasing logic cells 128 via exposure to light, which will be described in greater detail below.

Figure 2:
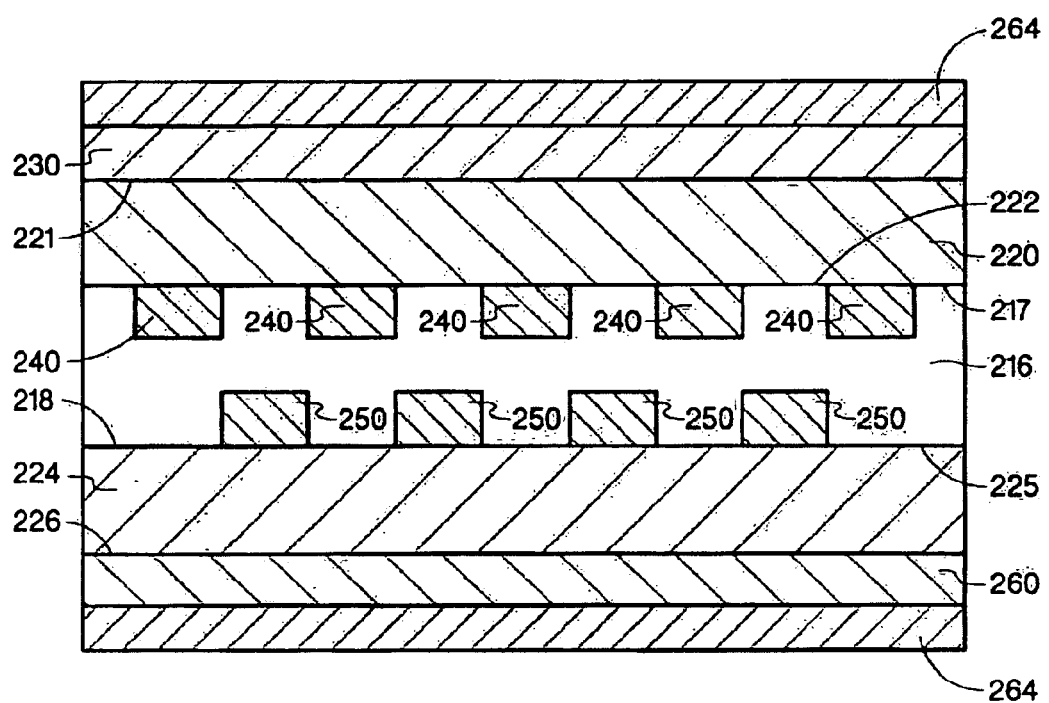
FIG. 2 is a cross-sectional view of a memory device according to an embodiment of this invention.

An alternate embodiment of the present invention is shown in a cross-sectional view in FIG. 2. In this embodiment, two semiconducting polymer films or layers 220 and 224 are created on substrate 216. Although FIG. 2 illustrates utilizing two semiconducting polymer films disposed on a substrate, multilayers of semiconductor polymer film may also be utilized, depending on the application and particular electrical characteristics desired, as well as the environmental conditions in which the device will be used. In alternate embodiments, a single layer of semiconducting polymer film disposed over a substrate may also be utilized. The combination of electrical conductors 230, 240, 250, and 260 form a substantially 3 dimensional orthogonal x,y,z matrix. Such a multilayer dynamic memory, using traditional lithographic technologies for patterning and creating the electrical conductors, provides on the order of 5.0 Gbits/cm$^2$ of memory or larger depending on the number of layers used. Patterning of the semiconductor polymer films 220 and 224 is not required to achieve this bit density.

Semiconducting polymer layer 220 is disposed over first substrate side 217 with electrical conductors 240 disposed on substrate 216 and electrically coupled to second side 222 of semiconducting polymer layer 220. Electrical conductors 230 are electrically coupled to first side 221 of semiconducting polymer layer 220. Electrical conductors 250 are diposed on second substrate side 218 and electrically coupled to first side 225 of semiconducting polymer layer 224. Electrical conductors 260 are electrically coupled to second side 226 of semiconducting polymer layer 224. Electrical conductors 230, 240, 250, and 260 may be created from any of the metals or conductive materials, as described above, for the embodiment shown in FIG. 1. For example electrical conductors 240 and 250 may be formed from tantalum and electrical conductors 230 and 260 may be formed from polyaniline. In other embodiments, the electrical conductors may utilize all metals or all organic conductors or any combination thereof.

Substrate 216 may be formed from a wide variety of materials such as silicon, gallium arsenide, glass, ceramic materials, and plastics. In addition, metals and alloys can also be utilized, however, an electrically insulating layer is utilized to isolate the electrical conduction between the metal substrate and the electrical conductors. In particular, metals such as aluminum and tantalum that electrochemically form oxides, such as anodized aluminum or tantalum, can be utilized. Substrate 216 may also be a flexible polymer material such as polyimide, polyester (PET), polyethylene naphthalate (PEN), polyvinyl chloride, polybutylene terephthalate (PBT), polyethylene naphthalate (PEN), polypropylene (PP), polyethylene (PE), polyurethane, polyamide, polyarylates, and polyester based liquid-crystal polymers to name a few. The thickness of substrate 216 may range from about 5 micrometers to about 700 micrometers.

Passivation layer 264, is disposed over electrical conductors 230 and 260 as well as those portions of semiconducting polymer films 220 and 224 between the electrical conductors. Passivation layer 264 provides protection to the semiconducting polymer films and electrical conductors from damage and environmental degradation. Passivation layer 264 may be formed from any of a wide range of polymeric materials, such as, polyimide, polyetherimides, polybutylene terephthalate, polyester, polyethylene naphthalate (PEN), or epoxy, to name a few. In addition passivation layer 264 may also be formed from any of a wide range of non-conductive inorganic materials such as oxides, nitrides, carbides, and borides. Further, passivation layer 264 may also be formed, from any of a wide range of silicone RTV (room temperature vulicanization) encapsulants, from various silsesquioxane solutions, from metal alkoxide solutions, and from curable organic inorganic hybride coatings. The particular passivation material utilized will depend on the particular materials used for the substrate, semiconductor polymer layer, and electrical conductors, as well as the particular application in which memory device 200 will be utilized.

Figure 3:
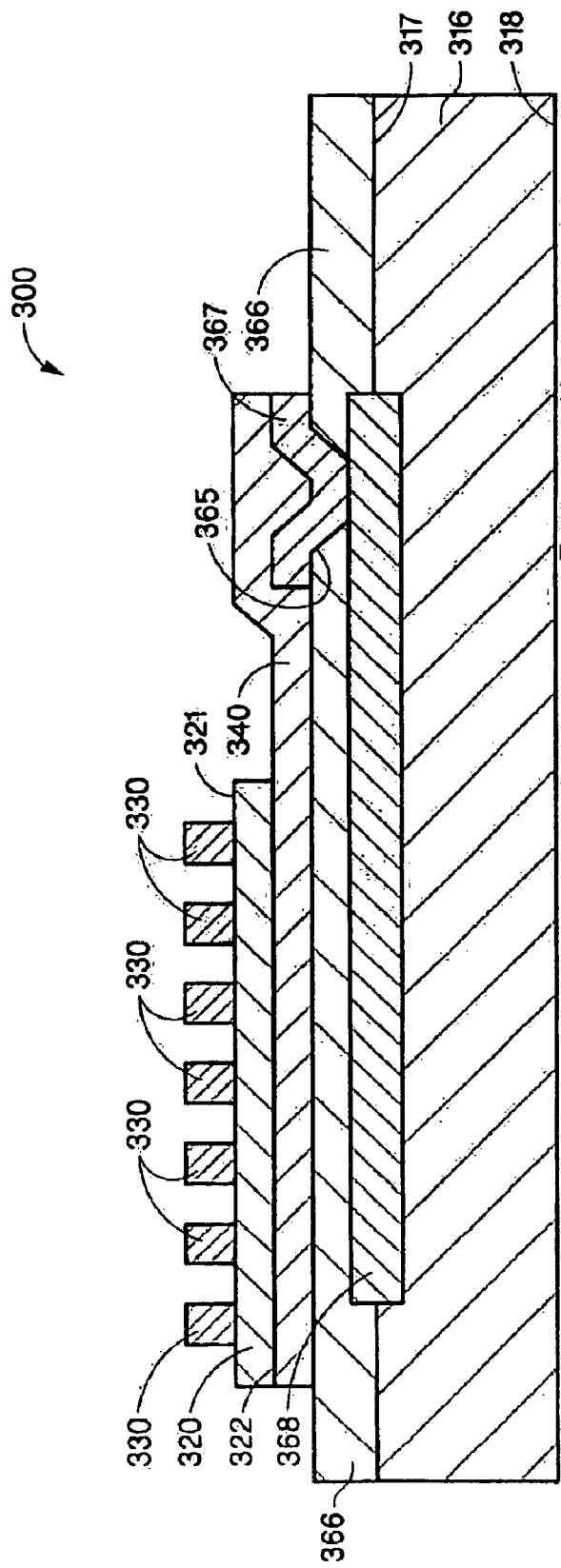
FIG. 3 is a cross-sectional view of a memory device according to an embodiment of this invention.

Referring to FIG. 3, an alternate embodiment of memory device 300 of the present invention is shown in a cross-sectional view. In this embodiment, semiconducting polymer film 320 forms a layer that includes an organic dopant (not shown) that is electrically coupled to one or more transistors 368. In this embodiment, substrate 316 is a silicon wafer having a thickness of about 300–700 micrometers. Using conventional semiconductor processing equipment, known to those skilled in the art, transistors 368 as well as other logic devices required for memory device 300 are formed on substrate 316. Those skilled in the art will appreciate that the transistors and other logic devices such as diodes may also be utilized, either separately or in combination with the one or more transistors. Transistors 368 are represented as only a single layer in FIG. 3 to simplify the drawing. Those skilled in the art will appreciate that transistors 368 can be realized as a stack of thin film layers. The particular structure of the transistors is not relevant to the invention, however some type of solid-state electronic device is present in this embodiment, such as, metal oxide field effect transistors (MOSFET), bipolar junction transistors (BJT). As described earlier other substrate materials can also be utilized. Accordingly these substrate materials will include one or more of the available semiconductor materials and technologies well known in the art, such as amorphous silicon, organic semiconductor devices, or thin-film-transistor (TFT) technology using, for example, poly-silicon on a glass substrate.

In this embodiment, substrate dielectric layer 366 is disposed over transistors 368 as well as other logic devices on substrate 316. Substrate dielectric layer 366 provides electrical isolation for transistors 368 as well as other logic devices. In this embodiment, substrate dielectric layer 366 is silicon oxide ($Si_xO_y$), however, other dielectric materials such as polyimide, benzocyclobutene, silicon nitride, silicon carbide, aluminum oxide, boron nitride and other polymeric or inorganic dielectrics can be utilized. In addition, multiple substrate dielectric layers can also be utilized depending on the particular application in which memory device 300 is utilized. For example, substrate dielectric layer 366 can include a first substrate dielectric layer of silicon oxide ($Si_xO_y$) disposed over transistors 368 with a second substrate dielectric layer of silicon nitride ($Si_xN_y$) disposed over the silicon oxide layer and a third substrate dielectric layer of silicon carbide disposed over the silicon nitride layer.

Electrical conductors 340 are disposed over substrate dielectric layer 366 and electrically couple to electrical contact regions 367 of transistors 368 through via openings 365 formed in substrate dielectric layer 366. Semiconducting polymer film 320 is disposed over substrate 316 wherein second side 322 of semiconducting polymer film 320 electrically couples to electrical conductors 340. Electrical conductors 330 couple to first side 321 of semiconducting polymer film 320. Electrical conductors 330 are substantially mutually perpendicular to electrical conductors 340. The materials used for electrical conductors 340 and 350 can be any of the materials described in the previous embodiments.

Figure 4:
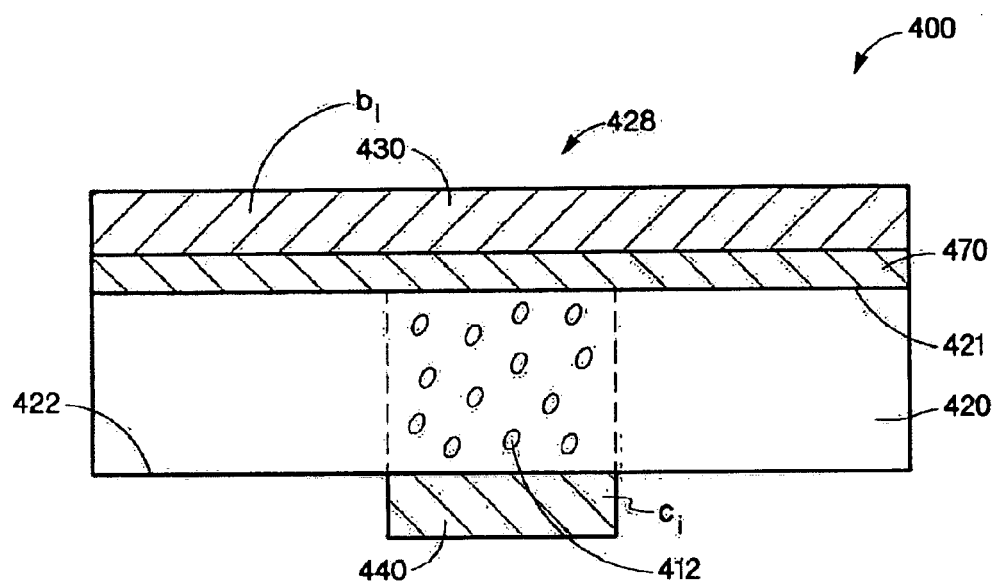
FIG. 4 is a cross-sectional view of a memory device according to an embodiment of this invention.

Referring to FIG. 4, an alternate embodiment of the present invention is shown in a cross-sectional view of memory device 400. In this embodiment, dielectric thin film 470 is interposed between semiconducting polymer film 420 that includes an organic dopant 412, and electrical conductors 430. In this embodiment, dielectric thin film 470 has a thickness in the range from about 1 nanometer to about 500 nanometers. The particular thickness will depend on the desired device characteristics such as the organic dopant, the binder material, the conductor material, sensing voltage, and bias voltage. Dielectric thin film 470 can be any polymeric or inorganic dielectric such as polycarbonate, polyimide, silicon oxide, or silicon oxynitride to name a few. In one embodiment, dielectric thin film 470 is utilized to block "back" injection (i.e. injection of charge when applying a voltage of opposite polarity to that used to inject charge) when erasing a particular logic cell by utilizing a voltage of opposite or reverse polarity as discussed in more detail later (see FIG. 6). In an alternate embodiment, dielectric thin film 470 and semiconducting polymer film 420 provides an interface to build up a "space charge" layer or "pin" trapped charge in the vicinity of the interface. In still another embodiment, dielectric thin film 470, may also be utilized to substantially hinder current flowing through a logic cell when applying a voltage across the cell.

Figure 5:
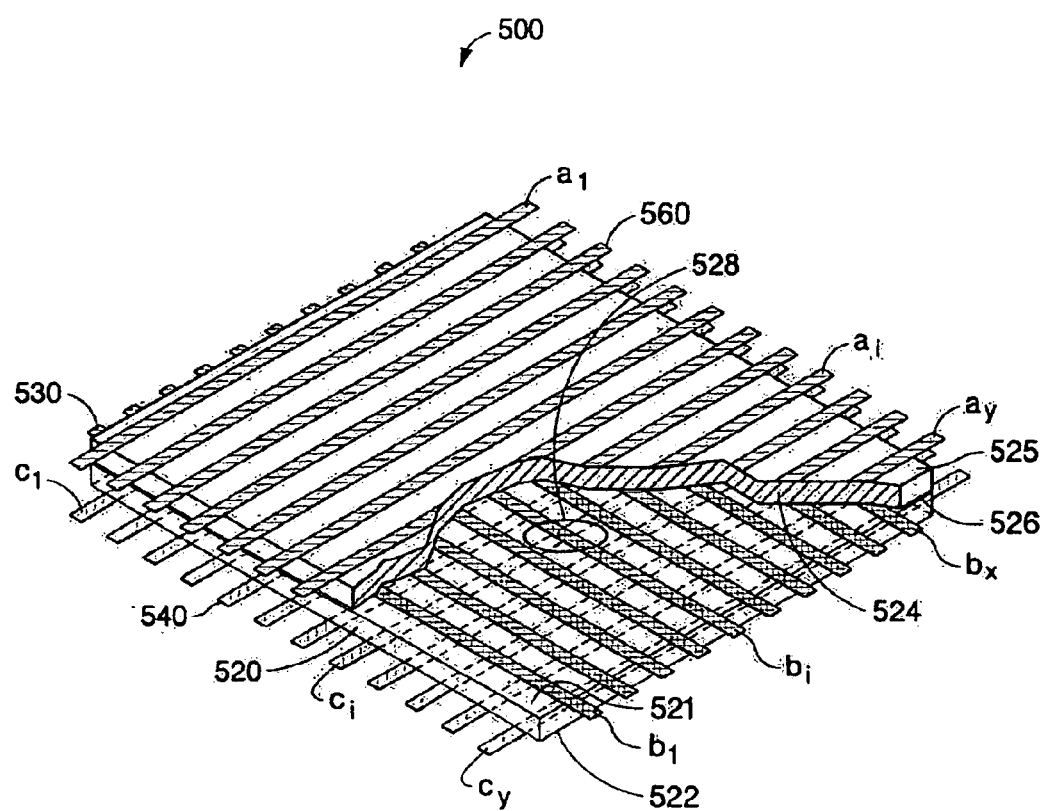
FIG. 5 is a perspective view of a memory device according to an embodiment of this invention.

Referring to FIG. 5. an alternate embodiment of the present invention is shown in a perspective view of memory device 500. In this embodiment, electrical conductors 530 electrically couple to both first side 521 of first semiconducting polymer film 520 and second side 526 of second semiconducting polymer film 524. Both polymer films 520 and 524 include an organic dopant (not shown). The particular organic dopant as well as its concentration may be the same in both semiconducting polymer films, or it may be dissimilar depending on the particular characteristics desired as well as the particular application in which memory device 500 will be utilized. Electrical conductors 540 are substantially parallel to each other and electrically coupled to second side 522 of first semiconducting polymer film 520. Electrical conductors 560 are substantially parallel to each other and electrically coupled to first side 525 of second semiconducting polymer film 524. Electrical conductors 530 are substantially parallel to each other and are substantially mutually orthogonal to electrical conductors 540 and 560.

Electrical conductors 540 are denoted as $c_j$, electrical conductors 560 are denoted $a_i$ and electrical conductors 530 are denoted $b_i$. The combination of electrical conductors 530, 540, and 560 form a substantially 3 dimensional orthogonal x,y,z matrix. Logic cell 528, in this embodiment, is addressed by applying the appropriate voltage across electrical conductors $c_i$ and $b_i$ whereas the logic cell located above logic cell 528 (not shown) is addressed by applying the appropriate voltage across electrical conductors $a_i$ and $b_j$. Although FIG. 5 illustrates two semiconducting polymer films stacked on top of each other, multiple layers may also be utilized. In addition, a substrate as illustrated in FIGS. 2 and 3 or a dielectric thin film as illustrated in FIG. 4 may also be utilized depending on the desired characteristics and particular application in which memory device 500 will be used. Such a multilayer dynamic memory, using traditional lithographic technologies for patterning and creating the electrical conductors, provides on the order of 5.0 Gbits/cm² of memory or larger depending on the number of layers used. Patterning of the semiconductor polymer film 520 or 524 is not required to achieve this bit density.

Figure 6:
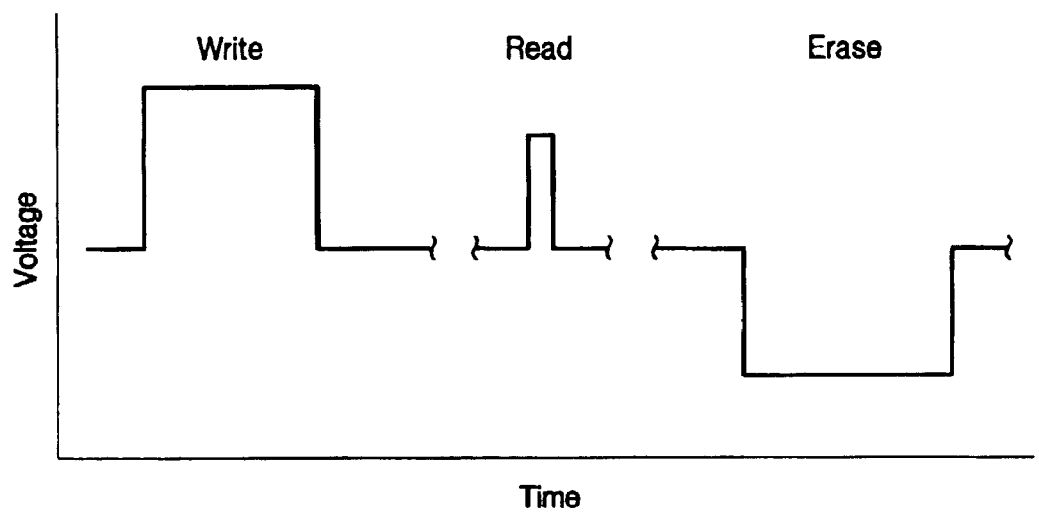
FIG. 6 is a graph of voltage applied to a memory device as a function of time according to an embodiment of this invention.

Referring to FIG. 6 a graph is shown illustrating various voltage pulses applied to a memory device, according to an embodiment of the present invention. By applying a voltage, of appropriate polarity, across the electrical conductors of a particular logic cell a "1" state can be "written" or created. When a voltage, of sufficient magnitude, is applied across the volume of semiconducting polymer film, located between two electrical conductors (i.e. electrical conductors 130 and 140 illustrated in FIG. 1b), an electric field is formed resulting in charge injection (electrons or holes) from one of the electrical conductors to the acceptor or donor molecules or functional groups, of the organic dopant of the semiconducting polymer film. The electrical charge can migrate in response to the electric field by "hopping" from one molecule to an adjacent molecule or functional group.

When the voltage is removed the charge becomes substantially "trapped" or localized on the organic dopant. The density of trapped charge is substantially proportional to the "soak" time (i.e. the writing time) the writing pulse is applied as well as the magnitude of the applied voltage. The localization of the "trapped" charge is dependent on the particular material chosen for the organic dopant and typically is related to the trapping energy. Typically the higher the trapping energy the longer the "trapped" charge will remain localized and thus the longer the time between refresh cycles.

The embodiment, shown in FIG. 4, utilizing a dielectric thin film interposed between and electrical conductor and the semiconducting polymer film can further increase the time the charge will remain localized. In this embodiment, a voltage of the appropriate polarity and lower in magnitude, than that required for writing a bit, is applied across the logic cell (i.e. electrical conductors 430 and 440) that "pins" the trapped charge in the vicinity of the dielectric thin film/ semiconducting polymer film interface. The charge will remain substantially localized, by keeping the applied voltage lower than that required for tunneling, at this interface. The time and magnitude of the applied voltage will depend, for example, on the particular organic dopant utilized, as well as, the dielectric thin film material, its thickness and electrical properties.

Figure 7:
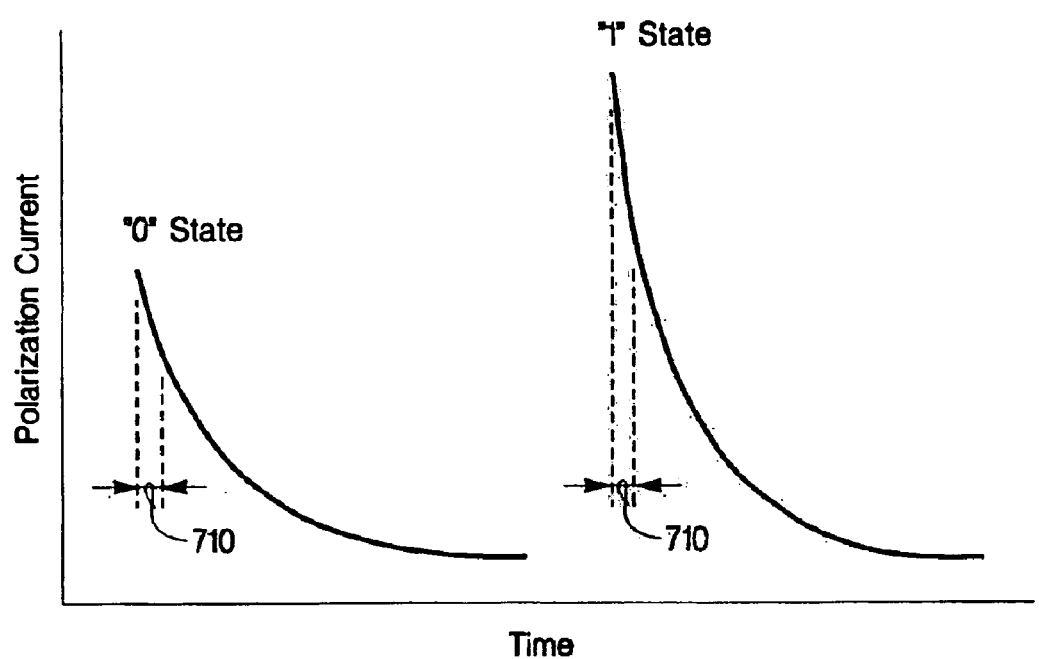
FIG. 7 is a graph of the polarization current as a function time according to an embodiment of this invention.

Once a "1" state has been written or created in a logic cell the logic cell may be interrogated or "read" by utilizing a voltage impulse across the electrical conductors of the logic cell and time resolving the polarization current as shown in FIG. 7. Typically the magnitude of the impulse voltage is less than the magnitude of the writing pulse to minimize the injection of additional charge into the logic cell. The physical displacement of the trapped charge, responding to the voltage impulse 710, generates a measurable polarization current as shown in FIG. 7. Logic cells that have not been "written" will exhibit a smaller polarization current than logic cells that have been "written." The polarization current before charge is injected represents a "0" for an unwritten cell, and the polarization current after charge is injected represents a "1" for a written cell as shown in FIG. 7. The particular magnitude and transient response or time decay of the polarization current will depend, for example, on the particular organic dopant utilized, the thickness of the semiconducting polymer film, and the presence or absence of a thin dielectric film to name a few factors. In addition, device dimensions such as electrical contact area and semiconducting polymer film thickness may be tuned to reduce the parasitic resistance and capacitance of a logic cell providing an ability to optimize the access time of a particular memory device. The access time for this type of memory device will depend on the width of the voltage impulse used and the response of the charge sensitive amplifier (not shown) used to measure the polarization current.

A logic cell in this type of memory device can also be erased (i.e. change the state from a "1" to a "0"). In one embodiment, erasure can be accomplished by applying a voltage pulse having an erasing polarity (i.e. typically a polarity opposite to that used to write a bit to the logic cell) across the electrical conductors of the particular logic cell being erased. The particular magnitude and erasing time utilized will depend, for example, on the particular organic dopant utilized, the charge mobility of the system, the thickness of the semiconducting polymer film, and the presence or absence of a thin dielectric film to name a few factors. Typically, the applied voltage will be less than the writing voltage to minimize injection of any stray charge.

In an alternate embodiment, erasure can be accomplished by exposing the semiconducting polymer film to light. Light of appropriate wavelength will form excitons (i.e. free electron-hole pairs) within the semiconducting polymer film that will recombine with the trapped charge resulting in erasure of the exposed logic cell. The particular wavelength utilized will depend, for example, on the particular dopant and binder material utilized. In this embodiment, one of the electrical conductors is a substantially optically transparent, electrically conductive material such as indium tin oxide. A focused light beam may be utilized to selectively expose a logic cell to light. However, any of the other standard techniques such as lasers or shadow masks may also be utilized to expose selective logic cells in this embodiment.

Figure 8:
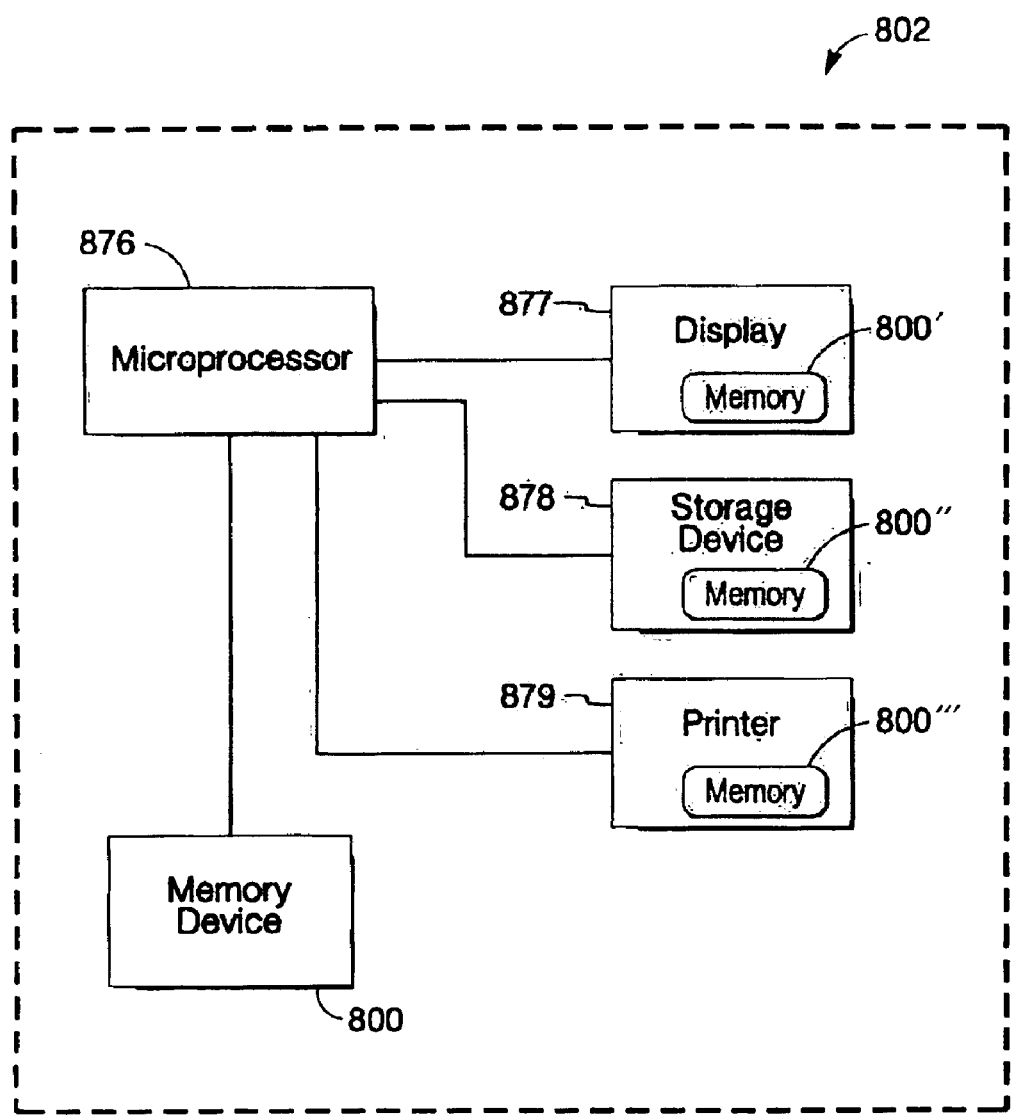
FIG. 8 is a block diagram of computer system according to an embodiment of this invention.

Referring to FIG. 8 an exemplary embodiment of a computer system 802 utilizing a memory device 800 of the present invention in a simplified block diagram is shown. In this embodiment, computer system 802 includes microprocessor 792, such as an Intel Xeon or Pentium Processor™ or compatible processor that is well known in the art. Microprocessor 876 is connected to memory device 800 that includes computer readable memory that is capable of holding computer executable commands used by microprocessor 876 to control data or input/output functions or both. Memory device 800 can also store data that is manipulated by microprocessor 876. Microprocessor 876 is also connected to storage device 878, display 877 and printer 879. Display 877 including an integrated circuit, storage device 878 including a storage medium, and printer 879 including an integrated circuit contain memory devices 800', 800", and 800'" respectively. Each memory device 800', 800", and 800'" includes an embodiment of the present invention as exemplified in earlier described figures and text showing various memory devices including a semiconducting polymer film with an organic dopant.

Figure 9:
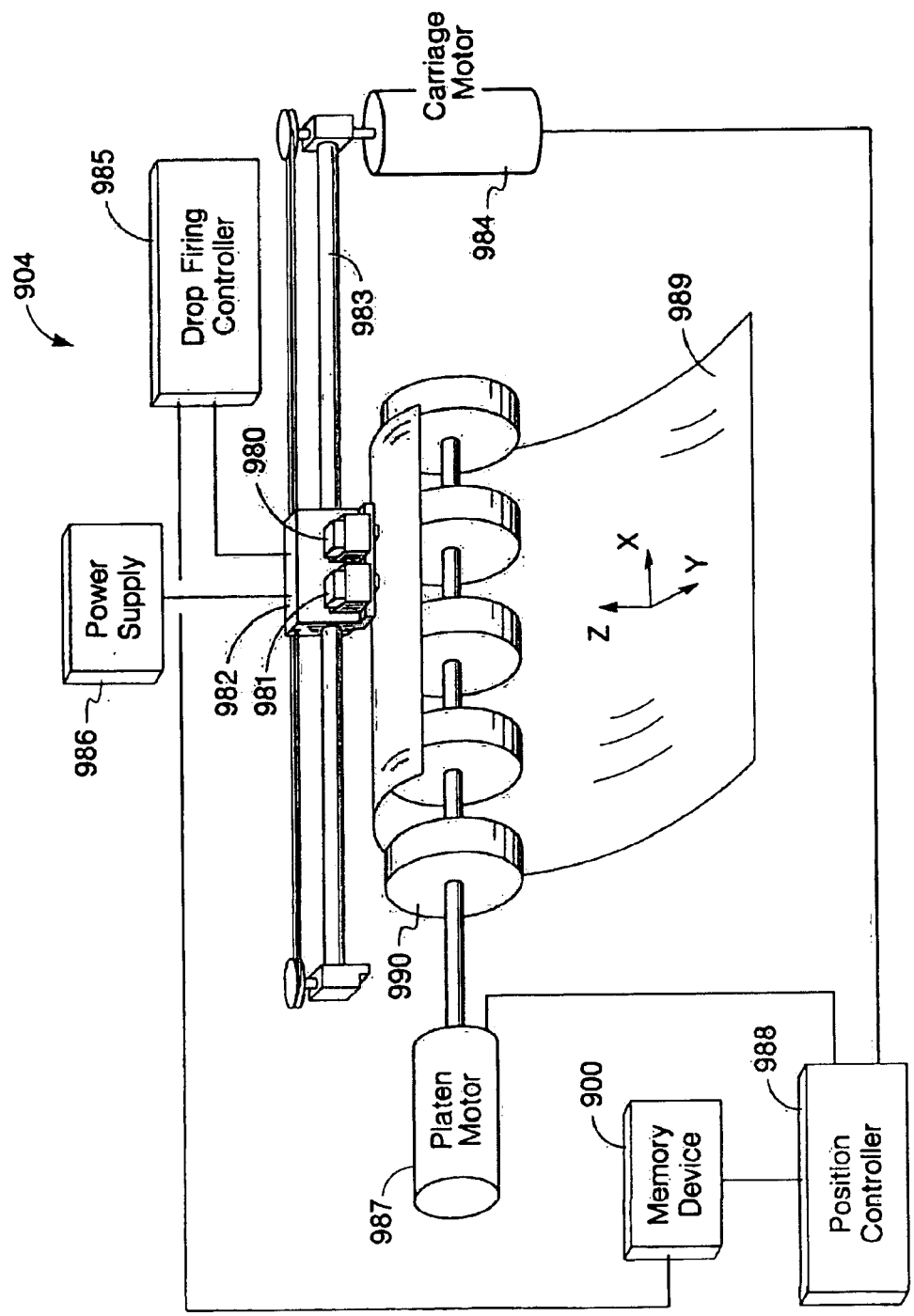
FIG. 9 is a perspective view of a fluid dispensing system according to an embodiment of this invention.

Referring to FIG. 9, an exemplary embodiment of a printing or fluid ejection system 904 of the present invention is shown in a perspective view. In this embodiment, memory device 900 provides operating instructions to position controller 988 and drop firing controller 985. Carriage 982 is typically supported by slide bar 983 or similar mechanism within system 904 and physically propelled along slide bar 983 by carriage motor 984 to allow carriage 982 to be translationally reciprocated or scanned back and forth across fluid receiving medium 989. The scan axis, X, is indicated by an arrow in FIG. 9.

When a printing operation is initiated, fluid receiving medium 989, such as paper, an ingestible sheet, or other medium onto which a fluid can be deposited, is fed into a printing or dispensing area by rollers 990 and platen motor 987 of fluid ejection system 904. Once fluid receiving medium 989 is properly positioned, carriage 982 may traverse receiving medium 989 such that one or more fluid ejection cartridges 980 and 981 may eject fluid onto receiving medium 989 in the proper position. Fluid receiving medium 989 may then be moved incrementally, so that carriage 982 may again traverse receiving medium 989, allowing the fluid ejection cartridges 980 and 981 to eject fluid onto a new position on receiving medium 989. Typically the drops are ejected to form predetermined dot matrix patterns, forming for example images or alphanumeric characters.

Rasterization of the data can occur in a host computer such as a personal computer or PC (not shown) prior to the rasterized data being sent, along with the system control commands, to the system and stored in memory device 900, although other system configurations or system architectures for the rasterization of data are possible. This operation is under control of system driver software resident in the system's computer. The system interprets the commands and rasterized data to determine which drop ejectors to fire. An arrow in FIG. 9 indicates the fluid drop trajectory axis, Z, directed from fluid ejection cartridges 980 and 981 toward fluid receiving medium 989. When a swath of fluid ejection has been completed, fluid receiving medium 989 is moved an appropriate distance along the fluid receiving medium axis, Y, indicated by the arrow, in preparation for the next swath. This invention is also applicable to dispensing systems employing alternative means of imparting relative motion between the fluid ejection cartridges and the fluid receiving medium, such as those that have fixed fluid ejection cartridges and move the fluid receiving medium in one or more directions, and those that have fixed fluid receiving medium and move the fluid ejection cartridges in one or more directions.

Figure 10:
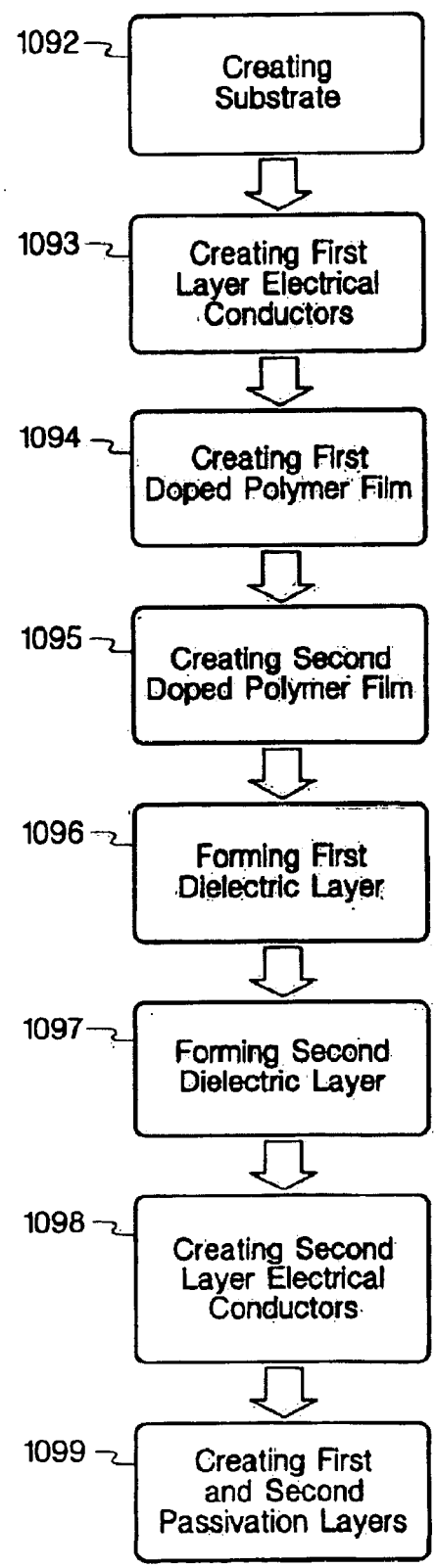
FIG. 10 is a flow chart of a method of fabricating a memory device according to an embodiment of this invention.

A method of manufacturing an electronic device utilizing a semiconducting polymer layer including an organic dopant is shown as a flow diagram in FIG. 10. The process of creating a substrate 1092 depends on the particular application in which the memory device will be utilized.

For those applications desiring a flexible substrate, typically a wide variety of polymer film materials such as polyimide, polyester (PET), polyethylene naphthalate (PEN), polyvinyl chloride, polybutylene terephthalate (PBT), polyethylene naphthalate (PEN), polypropylene (PP), polyethylene (PE), polyurethane, polyamide, polyarylates, and polyester based liquid-crystal polymers to name a few, may be used to form the substrate. The thickness of the substrate may range from about 5 micrometers to about 700 micrometers depending on the particular material utilized as well as the particular application. Particularly thicknesses in the range from about 10 micrometers to about 75 micrometers may be utilized and more particularly thicknesses in the range from about 20 micrometers to about 30 micrometers can also be utilized. For those applications utilizing active devices on a flexible substrate typically conventional thin film processing equipment will be utilized to form the active devices, such as amorphous silicon or polysilicon thin film transistor (TFT) processes. However, various techniques utilized to produce organic or polymer based active devices may also be utilized. In addition, the techniques for thinning semiconductor wafers to make a flexible substrate with active devices may also be utilized.

For those applications desiring active semiconductor devices such as transistors, the substrate may be formed from silicon, gallium arsenide, indium phosphide, and silicon carbide to name a few. Active devices will be formed utilizing conventional semiconductor processing equipment. Other substrate materials can also be utilized, depending on the particular application in which the memory device will be used. For example various glasses, aluminum oxide and other inorganic dielectrics can be utilized. In addition, metals such as aluminum and tantalum that electrochemically form oxides, such as anodized aluminum or tantalum, can be utilized. Those applications utilizing non-semiconductor substrates, active devices can also be formed on these materials utilizing techniques such as amorphous silicon or polysilicon thin film transistor (TFT) processes or processes used to produce organic or polymer based active devices. Accordingly, the present invention is not intended to be limited to those devices fabricated in silicon semiconductor materials, but will include those devices fabricated in one or more of the available semiconductor materials and technologies known in the art.

The process of creating the first layer of electrical conductors 1093 may consist of sputter deposition, electron beam evaporation, thermal evaporation, or chemical vapor deposition of either metals or alloys and will depend on the particular material chosen for the electrical conductors. Conductive materials such as polyaniline, polypyrrole, pentacene, thiophene compounds, or conductive inks, may utilize any of the techniques used to create thin organic films. For example, screen printing, spin coating, dip coating, spray coating, ink jet deposition and in some cases, as with PEDOT, thermal evaporation are techniques that may be used.

Depending on the particular memory device being fabricated, the electrical contacts may be created either on a substrate or directly on the semiconducting polymer film. Patterning of the electrical conductors is accomplished by any of the generally available photolithographic techniques utilized in semiconductor processing. However, depending on the particular material chosen, other techniques such as laser ablation or inkjet deposition may also be utilized. In particular one my utilized nanoimprint lithography or techniques for forming nanowires. For additional information on nanoimprint lithography see for example, S. Zankovych et al., *Nanoimprint Lithography: Challenges and Prospects,* 12 Nanotechnology 91, 91–95 (2001) or Wei Zhang and Stephen Chou *Multilevel Nanoimprint Lithography With Submicron Alignment over 4 in. Si Wafers,* 79 Applied Physics Letters 845, 845–847 (2001). For additional information on nanowire crossbar structures see for example, Yu Huang et al., *Directed Assembly of One-Dimensional Nanostructures Into Functional Networks,* 291 Science 630, 630–633 (2001). In addition, combinations of different conductive materials may also be utilized that might result in very different processes being utilized. For example it may be desirable to utilize PEDOT as the material for the lower electrical traces and indium tin oxide for the upper electrical traces if erasure via light is desired. Another embodiment may use a typical metal such as tantalum, tungsten, or even highly doped polysilicon for electrical conductors deposited on the substrate and an organic conductor such as PEDOT for electrical conductors deposited on the semiconducting polymer film. The process of creating a third layer of electrical conductors on a second semiconducting polymer film, for the applications utilizing such a layer, can be the same or similar to that used for the first layer, depending on whether the electrical conductor is the same as that used for the first layer electrical conductors.

The process of creating a semiconducting polymer film including an organic dopant 1094 will depend on the particular binder and organic dopant chosen. The particular binder and organic dopant chosen will depend, for example, on the particular electronic properties desired, the environment in which the device will be used, and whether a thin dielectric film will be utilized. Depending on the particular binder chosen the appropriate solvents are utilized that provide sufficient solubility for both the binder and the organic dopant as well as providing appropriate viscosity for the particular coating or casting process chosen. An exemplary process for creating a semiconducting polymer layer uses HPLC grade tetrahydrofuran as a solvent to dissolve the binder bisphenol-A-polycarbonate and a mono-substituted diphenylhydrazone compound (DPH) in appropriate concentrations to obtain the desired electrical properties. If a substrate is utilized, as shown, for example, in FIGS. 2 and 3, then the composition and properties of the substrate are also taken into consideration, in order to obtain good adhesion between the substrate and the semiconductor polymer layer, as well as the electrical conductors and the semiconductor polymer layer. Adhesion promoters or surface modification may also be utilized. In addition, a planarizing layer may also be utilized, for example, when electrical conductors are formed on rather than in the substrate. The process of creating a second or multilayer semiconductor polymer film 1095, for those applications utilizing such a structure, can be the same or similar as the process used to create the first layer, depending on whether the binder or organic dopant is the same as that used for the first layer.

The process of forming a first 1096 dielectric thin film, will depend on the particular material chosen, and may consist of, for example, sputter deposition, chemical vapor deposition, spin coating, or electrochemical oxidation. For example, tantalum electrical conductors may be deposited using conventional sputtering or electron beam deposition techniques. After the tantalum is deposited a thin tantalum oxide layer may be formed electrochemically. This process may be performed prior to or after photolithographic processing to define the electrical conductors. Another embodiment may utilized a thin silicon oxide layer deposited on the electrical conductors or on the semiconducting polymer film depending on which electrical conductor is chosen to have the thin dielectric film. A thin silicon oxide film may be deposited by any of a wide range of techniques, such as sputter deposition, chemical vapor deposition, or spin coating of a spin on glass material, to name a few. Still another embodiment may utilize a thin non-conducting polymer layer, such as the binder polymer, deposited on the appropriate electrical conductors. Other embodiments may utilize self assembled monolayers or silane coupling agents to produce a thin dielectric film. The process of creating a second or multilayer dielectric thin film 1097, for those applications utilizing such a structure, can be the same or similar as the process used to create the first layer, depending on whether the thin dielectric film is the same as that used for the first layer.

The process of creating the second layer of electrical conductors 1098 will depend, for example, on the particular binder and organic materials chosen as well as the presence or absence of the thin dielectric film and its chemical composition. For example, a polyimide binder will typically sustain higher temperatures than a polyethylene binder will. Thus, thermal or electron beam deposition of tungsten or platinum electrical conductors may be used on a polyimide binder whereas chemical vapor deposition, spin coating or thermal evaporation of an organic conductor may be desirable for a polyethylene binder. The particular deposition process utilized will also depend on the degree of defects generated in either the thin dielectric film if used or the semiconducting polymer film. In addition, the particular process as well as the process parameters will also be chosen to optimize adhesion between the film or films to which the electrical conductor material is deposited on. The process of creating a fourth layer of electrical conductors, for those applications utilizing such a structure, can be the same or similar as the processes used to create the first through third layers, depending on whether the fourth layer is the same as that used for the first layer.

The process of creating a first passivation layer 1099 is used to protect the semiconducting polymer film from damage and environmental degradation when appropriate. For example, a passivation layer providing a barrier to oxygen permeation can be desirable when utilizing a memory device having an acceptor organic dopant or functional group because oxygen is a potential electron trap. In addition, depending on the particular organic dopant and electrical conductors utilized it may also be desirable to utilize a passivation layer providing a moisture barrier to reduce corrosion. Further depending on whether active devices are present an electrostatically dissipating or shielding film may also be desirable.

The particular passivation layer utilized will also depend on the particular application and environment in which the memory device will be used. For example, a moisture barrier film material such as polyethylene, liquid crystal polymer films, and even a metal or inorganic layer may be utilized. An example of an electrostatically dissipating film that may be utilized is treated polyethylene with a surface resistivity from about $10^9$ to about $10^{13}$ ohms/square, however, other materials can be utilized such as carbon black filled polymers, and even a metal formed on the surface of the electrostatically dissipating layer. However, a surface resistivity of $10^4$ ohms per square may be used for those memory devices that contain sensitive circuitry to protect, such as complimentary metal oxide semiconductors (CMOS). In particular the electrostatically dissipating layer may contain a static dissipating material such as the treated polyethylene to control triboelectric charging and a conductive layer such as a thin metal layer to act as a shield against electrostatic fields. An example of an oxygen barrier film that may be utilized is a liquid crystal polymer film; however, other materials such as metal layers or inorganic layers (e.g. silicon dioxide, aluminum oxide etc.) can also be used.

Figure 11:
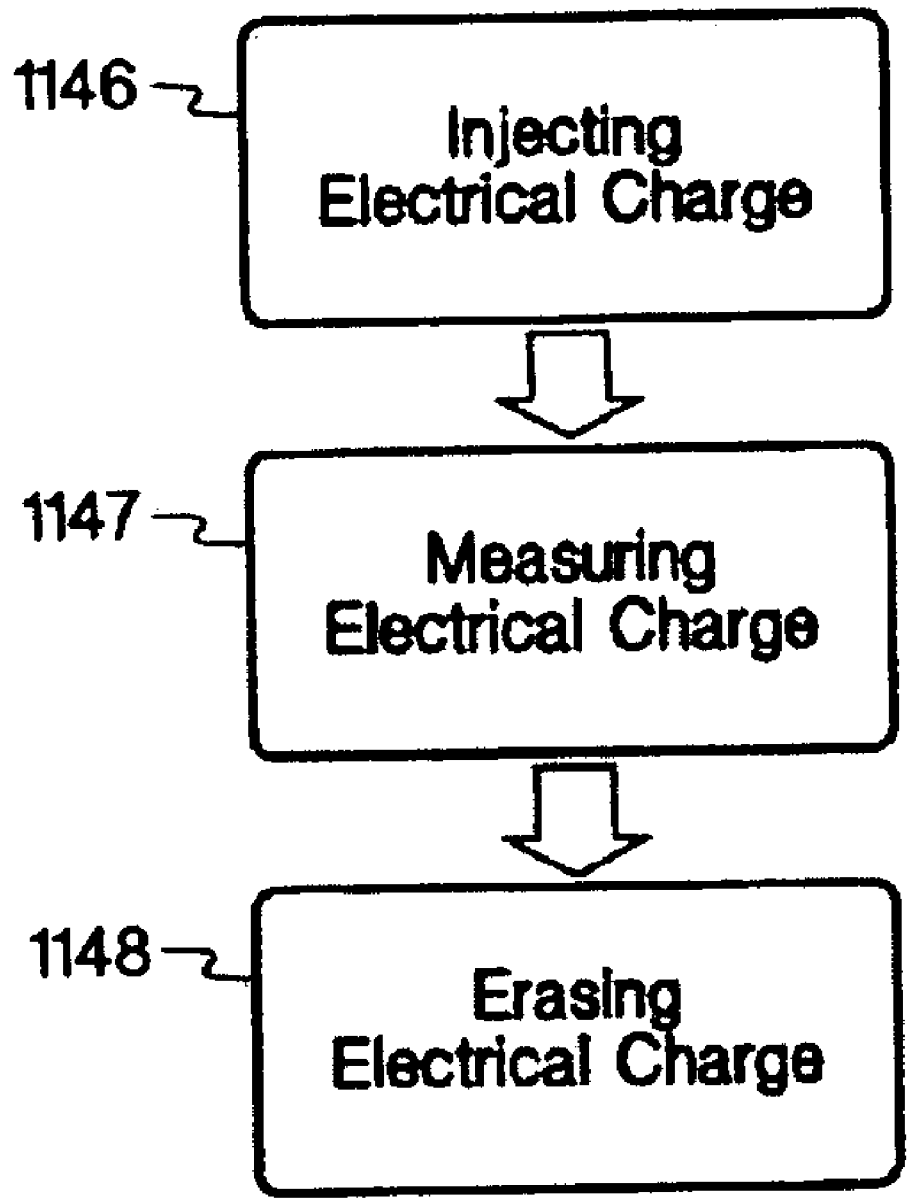
FIG. 11 is a flow chart of a method of using a memory device according to an embodiment of this invention.

The process of using an electronic device utilizing a semiconducting polymer layer including an organic dopant is shown as a flow diagram in FIG. 11. The process of injecting electrical charge 1146 in a logic cell will depend on the particular structure utilized in the memory device. When a voltage, of sufficient magnitude, is applied across the electrical conductors of a particular logic cell charge may be injected (electrons or holes) from one of the electrical conductors to the acceptor or donor functional groups of the organic dopant. When the voltage is removed the charge becomes substantially "trapped" or localized within the volume of the semiconducting polymer film located between the two electrical conductors. The amount or density of the trapped charge is substantially proportional to the time the voltage is applied as well as the magnitude of the applied voltage. The time and magnitude of the applied voltage will depend, for example, on the particular organic dopant utilized, as well as, the dielectric thin film material, its thickness and electrical properties.

The process of measuring or reading the electrical charge 1147 stored in a logic cell includes applying a voltage impulse across the electrical conductors of the logic cell measuring the transient response of the polarization current to the voltage impulse. Typically the magnitude of the impulse voltage is less than the magnitude of the voltage applied when injecting charge. The polarization current before charge is injected represents a "0" for an unwritten cell and the polarization current after charge is injected represents a "1" for a written cell. The particular magnitude and transient response or time decay of the polarization current will depend, for example, on the particular organic dopant utilized, the thickness of the semiconducting polymer film, and the presence or absence of a thin dielectric film to name a few factors.

The process of erasing the electrical charge 1148 stored in a logic cell may be achieved by electrical means or through exposure to light. Typically, applying a voltage pulse, usually of opposite polarity to that used to inject the charge, across the electrical conductors of a particular logic cell substantially removes the injected charge thus switching the logic cell from a "1" state to a "0" state. Typically, the magnitude of the applied voltage will be less than the voltage applied during charge injection to minimize injection of any stray charge, however, the time and magnitude of the voltage utilized to remove charge will depend, for example on the particular organic dopant or dopants used, the size and geometry of the logic cell, and the presence or absence of a thin dielectric film to name a few. The electrical charge stored in a logic cell may also be removed by exposing the volume of semiconducting polymer film forming a logic cell to light. Typically the one of the electrical conductors is an optically transparent electrically conductive material such as indium tin oxide.

While the present invention has been particularly shown and described with reference to the foregoing preferred and alternative embodiments, those skilled in the art will understand that many variations may be made therein without departing from the spirit and scope of the invention as defined in the following claims. This description of the invention should be understood to include all novel and non-obvious combinations of elements described herein, and claims may be presented in this or a later application to any novel and non-obvious combination of these elements. The foregoing embodiments are illustrative, and no single feature or element is essential to all possible combinations that may be claimed in this or a later application. Where the claims recite "a" or "a first" element of the equivalent thereof, such claims should be understood to include incorporation of one or more such elements, neither requiring no excluding two or more such elements.

What is claimed is:

1. A method of manufacturing a memory device, comprising:

creating a first semiconducting polymer film having a first side and a second side, and said first semiconducting polymer film includes mono-substituted diphenylhydrazone, wherein an electrical charge is localized in said first semiconducting polymer film;

creating a first plurality of electrical conductors substantially parallel to each other electrically coupled to said first side of said first semiconducting polymer layer; and creating a second plurality of electrical conductors substantially parallel to each other, electrically coupled to said second side of said first semiconducting polymer film and substantially mutually orthogonal to said first plurality of electrical conductors.

2. The method in accordance with claim 1, further comprising creating a substrate having a first side and a second side, wherein said second plurality of electrical conductors is disposed over said first side of said substrate.

3. The method in accordance with claim 2, further comprising:

creating a third plurality of electrical conductors substantially parallel to each other disposed on said second side of said substrate;

creating a second semiconducting polymer film having a first side and a second side, disposed over said second side of said substrate, said first side of said second semiconducting polymer film electrically coupled to said third plurality of electrical conductors, wherein said second semiconducting polymer film includes an organic dopant; and creating a fourth plurality of electrical conductors substantially parallel to each other, electrically coupled to said second side of said second semiconducting polymer film and substantially mutually orthogonal to said third plurality of electrical conductors.

4. The method in accordance with claim 2, wherein creating a substrate further includes creating a semiconductor substrate having at least one transistor electrically coupled to said first semiconducting polymer film.

5. The method in accordance with claim 1, further comprising:

creating a second semiconducting polymer film, having a first side and a second side, said second side of said second semiconductor polymer film is electrically coupled to said first plurality of electrical conductors, wherein said second semiconducting polymer film includes an organic dopant; and creating a third plurality of electrical conductors substantially parallel to each other, electrically coupled to said first side of said second semiconducting polymer film and substantially mutually orthogonal to said first plurality of electrical conductors.

6. The method in accordance with claim 1, further comprising forming a dielectric layer having a polymer film side and an electrical conductor side, wherein said polymer film side of said dielectric layer couples to said first semiconducting polymer film, and said electrical conductor side of said dielectric layer contacts said first plurality of electrical conductors.

7. The method in accordance with claim 6, wherein forming said dielectric layer further comprises forming said dielectric layer utilizing a self assembled monolayer.

8. The method in accordance with claim 6, wherein forming said dielectric layer further comprises forming said dielectric layer utilizing a silane coupling agent.

9. The method in accordance with claim 1, further comprising creating a passivation layer over a portion of said first semiconducting polymer film and said first plurality of electrical conductors.

10. The method in accordance with claim 9, wherein creating said passivation layer further comprises creating a moisture barrier film.

11. The method in accordance with claim 9, wherein creating said passivation layer further comprises creating an air barrier film.

12. The method in accordance with claim 9, wherein creating said passivation layer further comprises creating an electrostatically dissipating film.

13. The method in accordance with claim 9, wherein creating said passivation layer further comprises creating an electrostatically shielding film.

14. The method in accordance with claim 1, wherein creating said first plurality of electrical conductors further comprises creating said first and said second plurality of electrical conductors utilizing inkjet deposition.

15. The method in accordance with claim 1, wherein creating said first plurality of electrical conductors further comprises creating said first plurality of electrical conductors utilizing nanoimprint lithography.

16. The method in accordance with claim 1, wherein creating said first plurality of electrical conductors further comprises creating said first plurality of electrical conductors utilizing nanowire forming techniques.

17. A memory device produced by the process in accordance with claim 1.

18. A method of using a memory device, comprising:

injecting an electrical charge into a semiconducting polymer film having a first side and a second side, wherein said semiconducting polymer film includes monosubstituted diphenylhydrazone;

measuring said electrical charge in said semiconducting polymer film; and erasing said electrical charge in said semiconducting polymer film.

19. The method in accordance with claim 18, wherein measuring said electrical charge further comprises:

applying a voltage impulse across said first side and said second side of said semiconducting polymer film for a predetermined time and a predetermined magnitude; and measuring the transient response of the polarization current.

20. The method in accordance with claim 18, wherein injecting said electrical charge further comprises applying a voltage, having a writing polarity, across said first side and said second side of said semiconducting polymer film for a writing time and a writing magnitude.

21. The method in accordance with claim 20, wherein the density of said injected electrical charge is proportional to said writing time.

22. The method in accordance with claim 18, wherein erasing said electrical charge further comprises applying a voltage, having an erasing polarity, across said first side and said second side of said semiconducting polymer film for an erasing time and an erasing magnitude.

23. The method in accordance with claim 22, wherein said erasing polarity and an injection polarity are opposite polarities.

24. The method in accordance with claim 18, wherein erasing said electrical charge further comprises exposing said first side of said semiconductor polymer film to light for a predetermined time.

* * * * *